(12) United States Patent
Williams et al.

(10) Patent No.: US 7,199,936 B2
(45) Date of Patent: Apr. 3, 2007

(54) METHOD AND APPARATUS FOR POLARIZING ELECTROMAGNETIC RADIATION

(75) Inventors: David L. Williams, San Jose, CA (US); James Kardach, Saratoga, CA (US); Michael Goldstein, Ridgeford, CT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/386,496

(22) Filed: Mar. 21, 2006

(65) Prior Publication Data
US 2006/0193055 A1    Aug. 31, 2006

Related U.S. Application Data

(62) Division of application No. 10/956,197, filed on Sep. 30, 2004.

(51) Int. Cl.
G02B 27/14    (2006.01)
G02B 27/10    (2006.01)
G02B 27/28    (2006.01)
G03B 27/54    (2006.01)

(52) U.S. Cl. ............... 359/638; 359/629; 359/618; 359/495; 359/497; 355/67

(58) Field of Classification Search ........... 359/494, 359/495, 497, 618, 629, 638–640; 355/67, 355/71
See application file for complete search history.

(56) References Cited

U.S. PATENT DOCUMENTS

| | | | |
|---|---|---|---|
| 3,663,087 A | 5/1972 | Guillet et al. | |
| 4,894,608 A | 1/1990 | Ulmer, Jr. | |
| 6,108,131 A | 8/2000 | Hansen et al. | |
| 6,191,880 B1 | 2/2001 | Schuster | |
| 6,252,712 B1 | 6/2001 | Furter et al. | |
| 6,727,937 B1 | 4/2004 | Sukhanov et al. | |
| 6,885,502 B2 * | 4/2005 | Schuster | 359/485 |
| 6,972,830 B2 * | 12/2005 | Sewell | 355/67 |
| 2004/0169924 A1 | 9/2004 | Flagello et al. | |
| 2004/0184019 A1 | 9/2004 | Totzeck et al. | |

FOREIGN PATENT DOCUMENTS

WO    PCT/US2005/034157    9/2005

* cited by examiner

Primary Examiner—Loha Ben
Assistant Examiner—Jack Dinh
(74) Attorney, Agent, or Firm—George Chen (57) ABSTRACT

According to one aspect of the invention, a method and apparatus for polarizing electromagnetic radiation is provided. The electromagnetic radiation may be divided into first and second portions, substantially all of the first portion may be linearly polarized in a first direction and substantially all of the second portion may be linearly polarized in a second direction, the first direction being substantially orthogonal to the second direction. The linear polarization of at least one of the first and second portions may be changed such that substantially all of both of the first and second portions are linearly polarized in a third direction. At least one of the first and second portions may be redirected such that substantially all of both the first and second portions are propagating in a fourth direction.

4 Claims, 11 Drawing Sheets

METHOD AND APPARATUS FOR POLARIZING ELECTROMAGNETIC RADIATION

This is a Divisional Application of Ser. No. 10/956,197 filed Sep. 30, 2004, which is presently pending.

BACKGROUND OF THE INVENTION

1). Field of the Invention

Embodiments of this invention relate to a method and apparatus for polarizing electromagnetic radiation, particularly for use in semiconductor substrate processing.

2). Discussion of Related Art

Integrated circuits are formed on semiconductor wafers. The wafers are then sawed (or "singulated" or "diced") into microelectronic dice, also known as semiconductor chips, with each chip carrying a respective integrated circuit. Each semiconductor chip is then mounted to a package, or carrier, substrate. Often the packages are then mounted to a motherboard, which may then be installed into a computing system.

Numerous steps may be involved in the creation of the integrated circuits, such as the formation and etching of various semiconductor, insulator, and conductive layers. Before the various layers may be etched, a layer of light-sensitive photoresist is formed on the substrate to protect the portions of the substrate that are not to be etched.

Machines referred to as photolithography steppers are used to expose the desired pattern in the photoresist layer. In order to achieve the desired pattern, light is directed through a reticle, or "mask," and focused onto the substrate. Typically, the light sources used in the steppers emit light that is randomly polarized, which leads to a lack of precision in the exposure, as well as an increase in the size of the features that can be exposed.

Recently, attempts have been made to linearly polarize the light using a polarizing beam splitter which only captures 50 percent of the light that passes through it. However, because of the light used often has very small wavelengths, and is thus expensive to create, such a method is not cost effective as a large portion of the light is wasted.

BRIEF DESCRIPTION OF THE DRAWINGS

Embodiments of the invention are described by way of example with reference to the accompanying drawings, wherein.

DETAILED DESCRIPTION OF THE INVENTION

In the following description, various aspects of the present invention will be described, and various details set forth in order to provide a thorough understanding of the present invention. However, it will be apparent to those skilled in the art that the present invention may be practiced with only some or all of the aspects of the present invention, and the present invention may be practiced without the specific details. In other instances, well-known features are admitted or simplified in order not to obscure the present invention.

It should be understood that FIGS. 1 through 9B are merely illustrative and may not be drawn to scale.

FIG. 1 to FIG. 9B illustrate a method and apparatus for polarizing electromagnetic radiation, according to one aspect of the present invention. The electromagnetic radiation may be divided into first and second portions, substantially all of the first portion may be linearly polarized in a first direction and substantially all of the second portion may be linearly polarized in a second direction, the first direction being substantially orthogonal to the second direction. The linear polarization of at least one of the first and second portions may be changed such that substantially all of both of the first and second portions are linearly polarized in a third direction. At least one of the first and second portions may be redirected such that substantially all of both the first and second portions are propagating in a fourth direction.

According to another aspect of the present invention, a beam of electromagnetic radiation, having an axis, may be directed through a substantially uniform magnetic field. The electromagnetic radiation may be substantially linearly polarized in a first direction, and flux lines of the magnetic field may extend in a second direction. The first direction may be substantially orthogonal to the second direction. A first line extending from the axis of the beam and a first portion of the beam may be substantially perpendicular to the first direction. A second portion of the beam may be propagated through a first material, within the magnetic field, having a first Verdet value. The second portion of the beam may be linearly polarized in a third direction after propagating through the first material. A second line extending from the axis of the beam and the second portion of the beam may be substantially perpendicular to the third direction.

Figure 1:
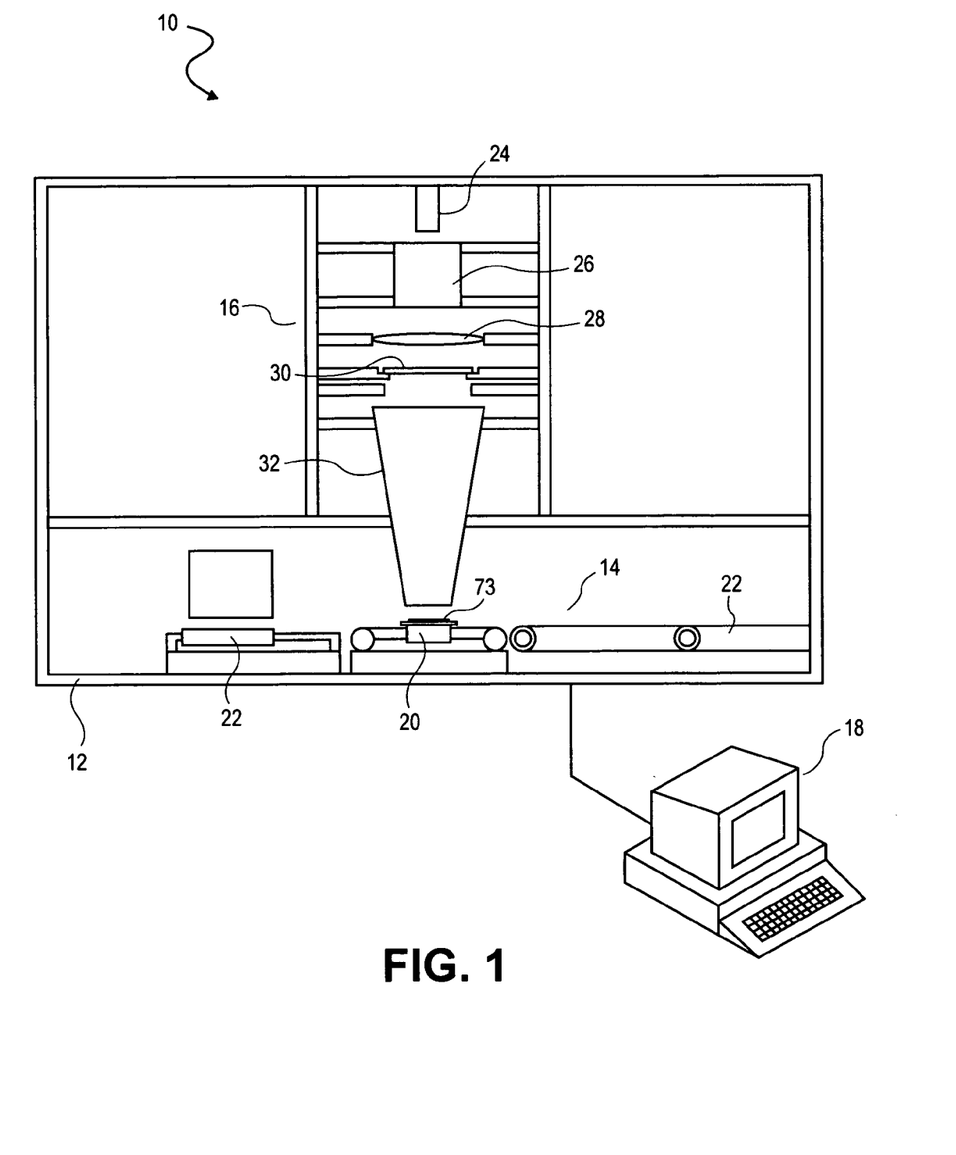
FIG. 1 is a cross-sectional schematic view of a semiconductor substrate processing apparatus.

FIG. 1 illustrates a semiconductor processing apparatus, or a photolithographic stepper 10, according to an embodiment of the present invention. The stepper 10 may include a frame 12, a substrate transport subsystem 14, an exposure subsystem 16, and a computer control console 18. The substrate transport subsystem 14 may be attached to and located at a lower portion of the frame 12 and may include a substrate support 20 and a substrate track 22. The substrate support 20 may be sized to support semiconductor substrates, such as wafers with diameters of, for example, 200 or 300 mm. Although not illustrated in detail, the substrate support 20 may include various actuators and motors to move the substrate support 20 in an X/Y coordinate system which may be substantially perpendicular to the sheet, or page, on which FIG. 1 is shown. The substrate track 22 may include various components to place a semiconductor substrate onto the substrate support 20 and remove the semiconductor substrate therefrom.

The exposure subsystem 16 may be connected to the frame 12 and suspended substantially over the substrate support 20. The exposure subsystem 16 may include an electromagnetic radiation source 24, a polarization subsystem 26, a collector 28, a reticle 30, and imaging optics 32.

The electromagnetic radiation source 24 may be a visible light source, such as a laser source, and be connected to the frame 12. In one embodiment, the electromagnetic radiation source 24 may be a deep ultraviolet (DUV) light source capable of emitting ultraviolet light having wavelengths of, for example, 248 nanometers, 193 nanometers, and/or 157 nanometers (nm).

Figure 2:
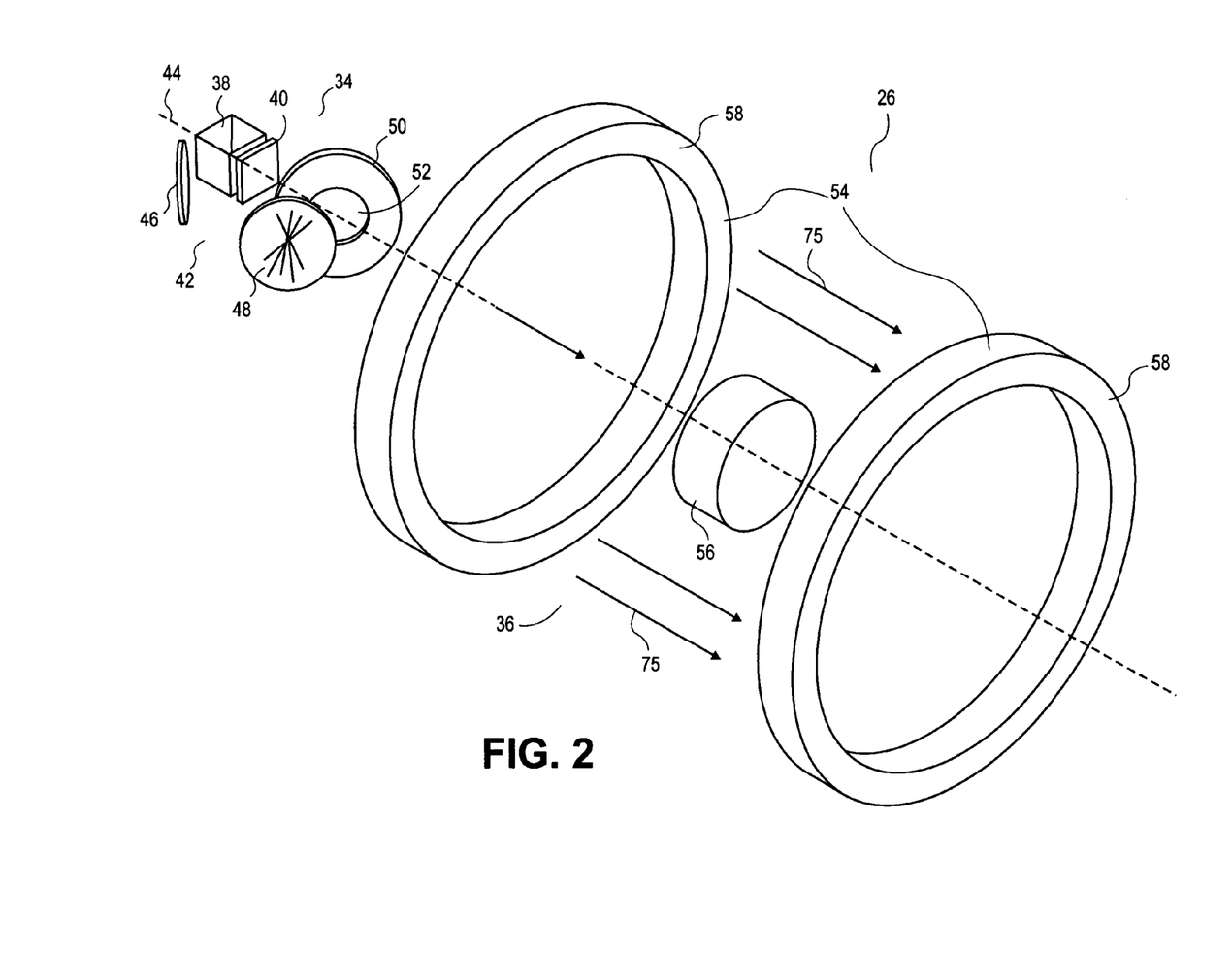
FIG. 2 is a perspective view of a polarization subsystem, including a linear polarization subsystem and an annular polarization subsystem.
Figure 3:
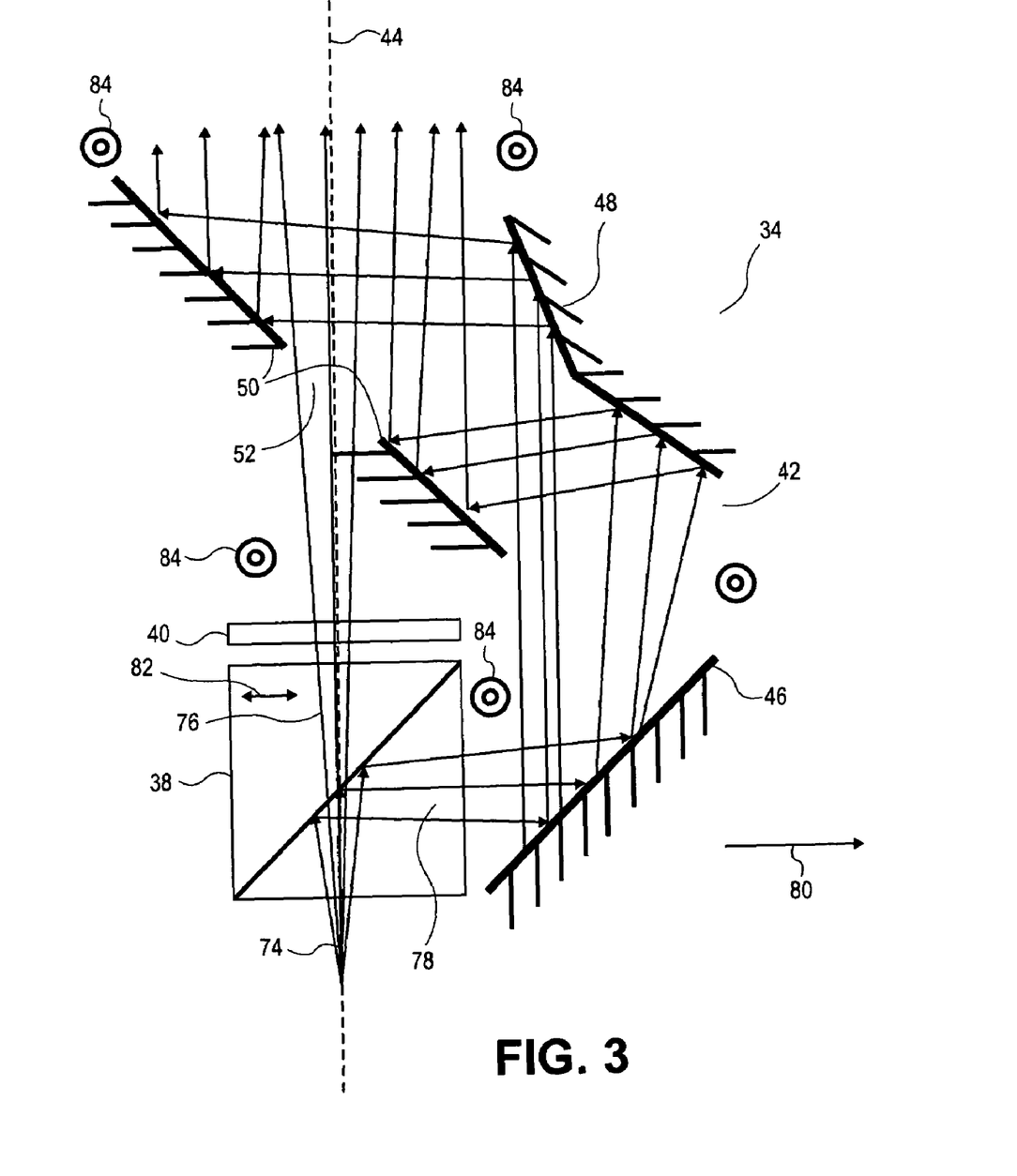
FIG. 3 is a cross-sectional schematic view of the linear polarization subsystem illustrated in FIG. 2.
Figure 4:
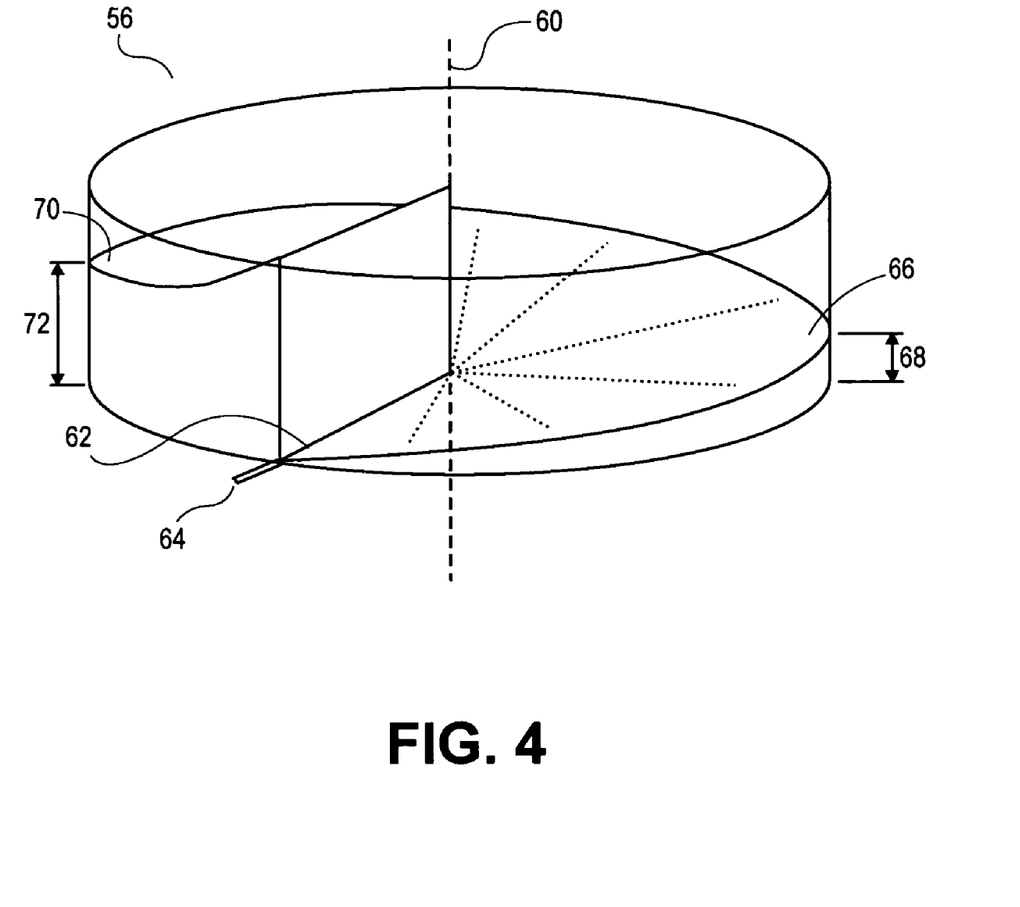
FIG. 4 is a perspective view of an annular polarization device for use in the annular polarization subsystem illustrated in FIG. 2.

FIGS. 2–4 illustrate the polarization subsystem 26. The polarization subsystem 26 may include a linear polarization subsystem 34 and an annular polarization subsystem 36. As illustrated in FIGS. 2 and 4, the linear polarization subsystem 34 may include a polarizing beam splitter 38, a wave-plate 40, and a reflecting system 42. The polarizing beam splitter 38 may include a central axis 44 which extends through a central portion of the wave-plate 40, and through a central portion of the annular polarization subsystem 36 as illustrated in FIG. 2. The wave-plate 40 may be a half wave-plate as is commonly understood in the art.

The reflecting system 42 may include a first reflective device 46, a second reflective device 48, and a third reflective device 50. The reflective devices 46, 48, and 50 may be mirrors. The first reflective device 46, as illustrated in FIGS. 2 and 3, may be substantially circular and be positioned such that a reflective surface thereof faces toward the central axis 44 of the polarizing beam splitter 38 at an angle of approximately 45 degrees. The second reflective device 48 may be substantially be conic in shape with a circular outer edge and have a reflective surface with an angled cross-section, as illustrated in FIG. 3. The second reflective device 48 may be positioned a distance from the first reflective device 42 in a direction that is substantially parallel to the central axis 44 of the polarizing beam splitter 38. The third reflective device 50 may be substantially circular in shape with a circular opening 52 at a central portion thereof. The third reflective device 50 may be positioned such that the central axis 44 of the polarizing beam splitter 38 passes through a central portion of the opening 52 and a reflective surface thereof faces partially toward the second reflective device 48 at an angle of approximately 45 degrees to the central axis 44.

Referring again to FIG. 2, the annular polarization subsystem 36 may include a magnetic field generator 54 and an annular polarization device 56. The magnetic field generator 54 may include, for example, two Helmholtz coils 58, as is commonly understood in the art. The Helmholtz coils 58 may include numerous coils of electrically conductive wire within and be positioned a distance apart with the central axis 44 perpendicular thereto and passing through a central portion thereof. The annular polarization device 56 may be cylindrically shaped and positioned such that the central axis 44 of the polarizing beam splitter 38 passes through a central portion thereof. Although not illustrated in detail, it should be understood that the Helmholtz coils 58 may have a central axis that is congruent with the central axis 44 of the polarizing beam splitter 38. Although not illustrated, the magnetic field generator 54 may also include a power supply that is electrically connected to the coils of wire within the Helmholtz coils 58.

FIG. 4 illustrates the annular polarization device 56 in greater detail. The annular polarization device 56 may be made of a material with a high Verdet constant, such as terbium gallium garnet (TGG), which has a Verdet constant of 0.12 min/Oe.cm at 1064 nm. The high Verdet constant material may be shaped to have a gradually increasing thickness around a central axis 60 of the annular polarization device 56. The central axis 60 of the annular polarization device 56 may be congruent with the central axis 44 of the polarizing beam splitter 38.

At a first portion 62 of the annular polarization device 56, extending radially from the central axis 60, the high Verdet constant material may have a first thickness 64 which may be negligible. At a second portion 66 of the annular polarization device 56 extending radially from the central axis 60, the high Verdet constant material may have a second thickness 68 which may be greater than the first thickness 64. At a third portion 70 of the annular polarization device 56, the high Verdet constant material may have a third thickness 72 which may be greater than the second thickness 68. Thus, as illustrated in FIG. 4, the upper surface of the high Verdet constant material "spirals" upwards around the central axis 60.

As one skilled in the art will appreciate, each portion of the annular polarization device 56 may be understood to have a particular "Verdet value" which may be based on the particular Verdet constant of the particular material and the thickness of the material at each particular portion. If either the thickness of the high Verdet constant material is increased, or the material itself is changed to increase the Verdet constant of the material, the amount of Faraday rotation experienced by electromagnetic radiation as it propagates through each particular portion of the material will increase as the Verdet value increases.

Although not illustrated for clarity, it should be understood that all of the components of the polarizing subsystem 26 may be connected to the frame 12.

Referring again to FIG. 1, the collector 28, the reticle 30, and the imaging optics 32 may be connected to the frame 12 and positioned under the polarization subsystem 26. The collector 28 may be in the form of a large lens, as is commonly understood in the art. The reticle 30 may be positioned below the collector 28 and may be in the form of "mask," as is commonly understood in the art, and may include a plurality of openings therein. The imaging optics 32 may be positioned below the reticle 30 and, although not illustrated in detail, may include a plurality of lenses of varying shapes and sizes.

The computer control console 18 may be in the form a computer having memory for storing a set of instructions and a processor connected to the memory for executing the instructions, as is commonly understood in the art. The computer control console 18 may be electrically connected to both the substrate transport subsystem 14 and the exposure subsystem 16, as well as all of the various components thereof, and may control and coordinate the various operations of the stepper 10.

In use, a semiconductor substrate 73, such as a wafer having a diameter of, for example, 200 or 300 mm, may be placed on the substrate support 20 by the substrate track 22. The substrate 73 may have a plurality of integrated circuits, divided amongst multiple microelectronic dice, formed thereon and a layer of photoresist deposited over the dice. The power supply of the magnetic field generator 54 may then be activated to supply power to the Helmholtz coils 58, resulting in a substantially uniform magnetic field, indicated by arrows 75 in FIG. 2, being generated between the Helmholtz coils 58. The magnet field may have a strength of between, for example, 0.1 and 1.0 Tesla.

The electromagnetic radiation source 24 may be activated to emit electromagnetic radiation, such as DUV light, toward the polarization subsystem 26. Referring now to FIGS. 2 and 3, the electromagnetic radiation 74 may enter the polarizing beam splitter 38 on a side opposite the wave-plate 40 and in a direction that is substantially parallel with the central axis 44 of the polarizing beam splitter 38. Although not illustrated in detail, as the electromagnetic radiation 74 enters the polarizing beam splitter 38, the electromagnetic radiation 74 may be randomly, or arbitrarily, polarized.

As the electromagnetic radiation 74 propagates through the polarizing beam splitter 38 along the central axis 44, the electromagnetic radiation 74 is split, or divided, into a first portion 76 and a second portion 78. The first portion 76 of the electromagnetic radiation 74 may pass through the polarizing beam splitter 38 along the central axis 44 and into the wave-plate 40. The second portion 78 of the electromagnetic radiation 74 may be reflected, or redirected, in a first direction 80 which is substantially perpendicular to the central axis 44 toward the first reflective device 46.

It should be understood that horizontal symbols 82 may indicate that the electromagnetic radiation 74 at that point may be linearly polarized in a direction that is substantially parallel to the arrows shown on the horizontal symbols 82 and/or the page on which the horizontal symbols 82 appear. Vertical symbols 84 may indicate that the electromagnetic radiation 74 at that point is linearly polarized in a direction that is perpendicular to the sheet on which the vertical symbols 84 appear. Therefore, electromagnetic radiation associated with a horizontal symbol 82 may have a linear polarization in a direction that is orthogonal, or perpendicular, to electromagnetic radiation that is associated with a vertical symbol 84. As one skilled in the art will appreciate, the directions indicated by symbols 82 and 84 may specifically refer to the direction of linear polarization of the E-field of the electromagnetic radiation.

Thus, as illustrated in FIG. 3, the first portion 76 of the electromagnetic radiation 74 may become linearly polarized in a direction as indicated by the horizontal symbols 82 as it passes through the polarizing beam splitter 38. Likewise, the second portion 78 of the electromagnetic radiation 74 may become linearly polarized in a direction as indicated by the vertical symbols 84 as it is redirected by the polarizing beam splitter 38.

As the first portion 76 of the electromagnetic radiation 74 passes through the wave-plate 40, the first portion 76 may become linearly polarized in a direction as indicated by the vertical symbols 84. Thus, after the first portion 76 has passed through the wave-plate 40 both the first 76 and second 78 portion of the electromagnetic radiation 74 may be linearly polarized in a direction as indicated by the vertical symbols 84.

The first portion 76 of the electromagnetic radiation 74 may continue to propagate along the central axis 44 of the polarizing beam splitter 38 and pass through the opening 52 of the third reflective device 50.

The second portion 78 of the electromagnetic radiation 74 may be reflected by the first reflective device 46 toward the second reflective device 48 in a direction that is substantially parallel to the central axis 44 of the polarizing beam splitter 38. The second portion 78 may then be reflected by the second reflective device 48 toward the third reflective device 50.

Still referring to FIG. 3, because of the conic shape of the reflective surface of the second reflective device 48, substantially all of the second portion 78 of the electromagnetic radiation 74 may be reflected toward the reflective surface of the third reflective device 50. In particular, substantially none of the second portion 78 of the electromagnetic radiation 74 may be reflected by the second reflective device 48 into the opening 52 of the third reflective device 50. The second portion 78 of the electromagnetic radiation 74 may be reflected by the third reflective device 50 in a direction substantially parallel to the central axis 44 of the polarizing beam splitter 38 away from the polarizing beam splitter 38 and, as illustrated in FIG. 2, toward the annular polarization subsystem 36.

Figure 5:
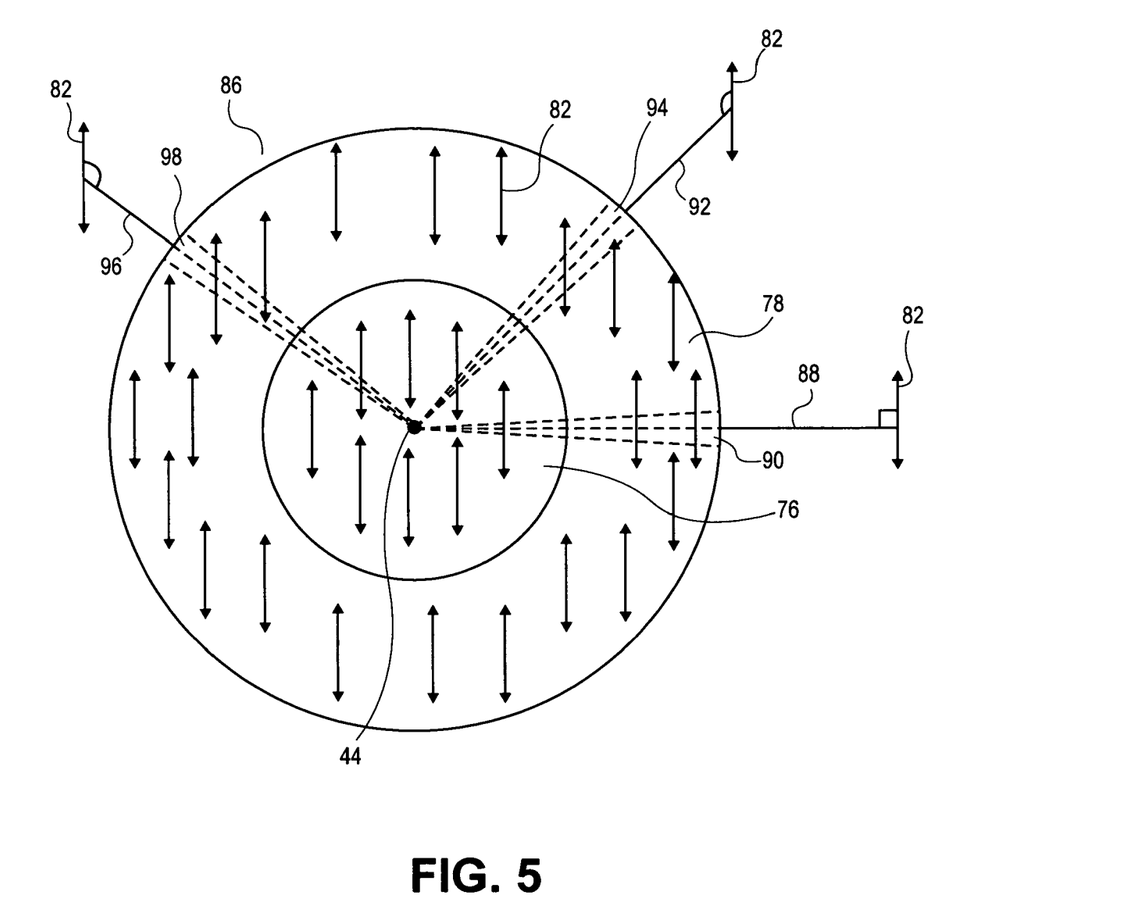
FIG. 5 is a cross-section of a beam of electromagnetic radiation propagating from the linear polarization subsystem illustrated in FIGS. 2 and 3.

As the first 76 and second 78 portions of the electromagnetic radiation propagate away from the linear polarization subsystem 34, the first 76 and second 78 portions may jointly form a beam of electromagnetic radiation. FIG. 5 illustrates the beam 86 of electromagnetic radiation as it propagates toward the annular polarization subsystem 36. The beam 86 of electromagnetic radiation may include the first portion 76 and the second portion 78 of electromagnetic radiation 74 from the linear polarization subsystem 34. All of the electromagnetic radiation of the beam 86 may linearly polarized in substantially the same direction as indicated by the horizontal symbols 82.

It should be understood that because of the change of the field of view between FIG. 3 and FIG. 5, the vertical symbols 84 of FIG. 3 and the horizontal symbols 82 of FIG. 5 may indicate a linear polarization in the same direction.

Referring to FIG. 5, the beam 86, when viewed in cross-section perpendicular to the central axis 44 of the polarizing beam splitter 38 may be substantially circular with the central axis 44 of the polarizing beam splitter 38 being congruent with a central axis thereof. A line 88 extending from the central axis 44 to a first portion 90 of the beam 86, which extends from the axis 44 to an outer edge of the beam 86, may be perpendicular to the direction of linear polarization as indicated by the horizontal symbols 82. Although not illustrated, it should be understood that the same may be true for a line drawn between a portion of the beam 86 on a side of the central axis 44 directly opposing the first portion 90. However, lines 92 and 96 extending from the central axis 44 to second 94 and third 98 portions of the beam 86, not directly opposite the first portion 90, may not be perpendicular to the direction of linear polarization as indicated by the horizontal symbols 82 in FIG. 5.

Referring again to FIG. 2, the beam 86 may continue to propagate into the magnetic field generated by the magnetic field generator 54 and into the annular polarization device 56. Although not illustrated in detail, it should be understood that the flux lines of the magnetic field may extend in the direction indicated by arrows 75, and thus may be orthogonal to the direction of linear polarization as indicated in FIG. 5.

Referring now to both FIGS. 4 and 5, the annular polarization device 56 may be positioned so that the first portion 90 of the beam 86 of electromagnetic radiation passes through the first portion 62 of the annular polarization device 56. The second portion 94 of the beam 86 of electromagnetic radiation may propagate through the second portion 66 of the annular polarization device. The third portion 98 of the beam 86 of electromagnetic radiation may propagate through the third portion 70 of the annular polarization device. Due to the high Verdet constant of the material of the annular polarization device 56, as well as the magnetic field generated by the magnetic field generator 54, as the electromagnetic radiation propagates through the high Verdet constant material, the polarization of the electromagnetic radiation may be rotated a particular amount depending upon the thickness of the high Verdet constant material and the value of the Verdet constant of the particular material used. Thus, after the beam 86 has propagated through the annular polarization device 56, the electromagnetic radiation of the beam 86 may no longer be linearly polarized as illustrated in FIG. 5.

Figure 6:
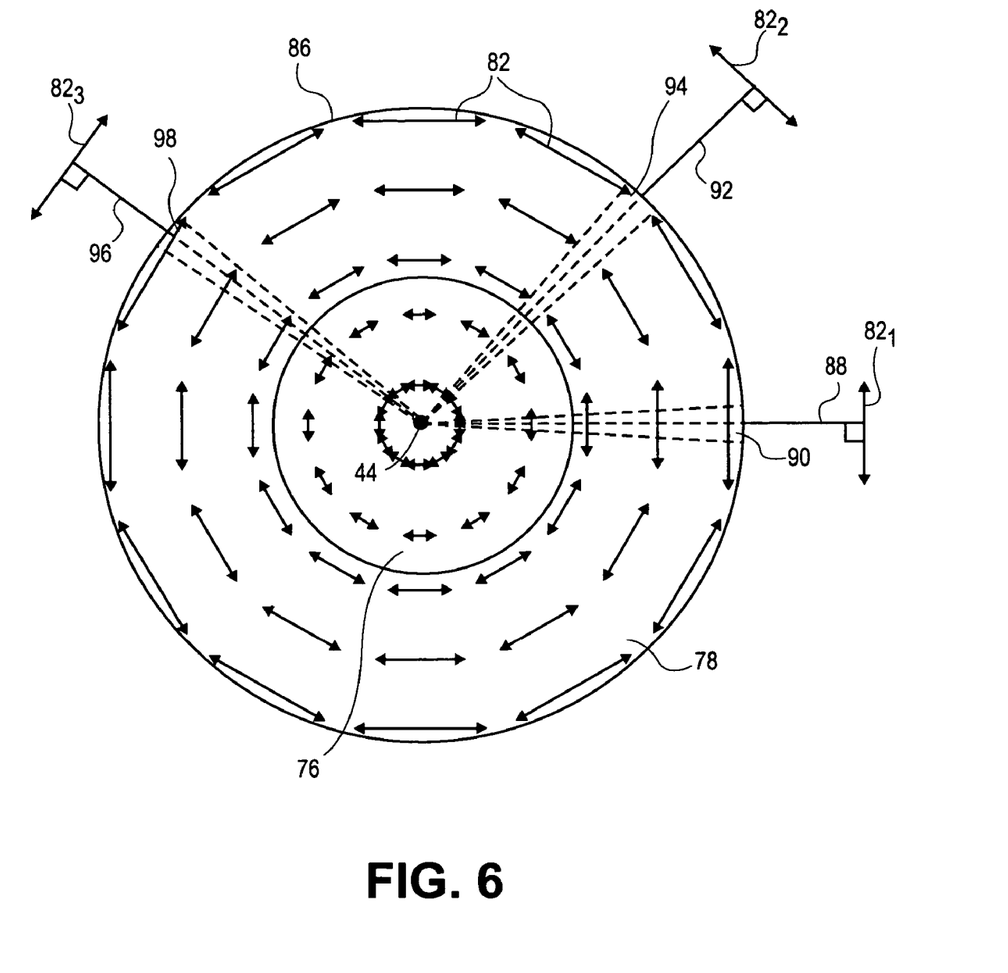
FIG. 6 is a cross-section of a beam of electromagnetic radiation propagating from the annular polarization subsystem illustrated in FIG. 2.

FIG. 6 illustrates the beam 86 of electromagnetic radiation after having propagated through the annular polarization device 56. The beam 86 may now be "annularly" polarized as illustrated in FIG. 6. Both the first 76 and second 78 portions of electromagnetic radiation may now be polarized such that a line drawn between the central axis 44 and each respective portion, or section, of either the first 76 or second 78 portions will be perpendicular to the linear polarization of each respective section. Thus, as illustrated in FIG. 6, the line 88 between the central axis 44 and the first portion 90 of the beam may remain perpendicular to the direction of linear polarization as indicated by the horizontal symbol $82_1$. Likewise, the line 92 drawn between the central axis 44 and the second portion 94 of the beam 86 may now be perpendicular to the direction of linear polarization as indicated by the horizontal symbol $82_2$ which indicates the direction of linear polarization for the second section 94. The same may be true for the third section 98, as the line 96 from the central axis 44 to the third portion 98 of the beam 86 may be perpendicular to the direction of linear polarization indicated by the horizontal symbol $82_3$ for the third section 98.

Referring to FIGS. 1 and 2, the beam of electromagnetic radiation may then propagate from the annular polarization subsystem 36 and into the collector 28. The collector 28 may focus the electromagnetic radiation through the reticle 30 and into the imaging optics 32. The imaging optics 32 may further focus the electromagnetic radiation before the electromagnetic radiation is directed onto the semiconductor substrate 73, where the electromagnetic radiation exposes the layer of photoresist, as is commonly understood in the art. It should be understood that the electromagnetic radiation may retain the annular polarization, as illustrated in FIG. 6, as the photoresist is exposed.

The wafer support 20 may move the semiconductor substrate 73 in the X/Y coordinate system so that individual sections of the semiconductor substrate 73, which may correspond with one or more of the dice, may be exposed one at a time, as is common understood in the art. When the entire photoresist layer has been exposed, the substrate track 22 may remove the semiconductor substrate 73 from the substrate support 22, and replace it with a second semiconductor substrate to be exposed as described above.

One advantage is that the electromagnetic radiation, as it exposes the photoresist layer, may be annularly polarized, as illustrated in FIG. 6. Therefore, size of the features exposed on the semiconductor substrate may be minimized and the accuracy with which the features are exposed can be increased. Another advantage is that the electromagnetic radiation may be linearly polarized, and annularly polarized, without a substantial portion of the electromagnetic radiation being lost, as all of the electromagnetic radiation is directed onto the substrate. Therefore, an increased amount of electromagnetic radiation may be directed onto the semiconductor wafer, increasing the exposure rate of the stepper.

A further advantage is that the polarization of the electromagnetic radiation may be controlled regardless of the polarization of the electromagnetic radiation being emitted by the electromagnetic radiation source.

Figure 7A:
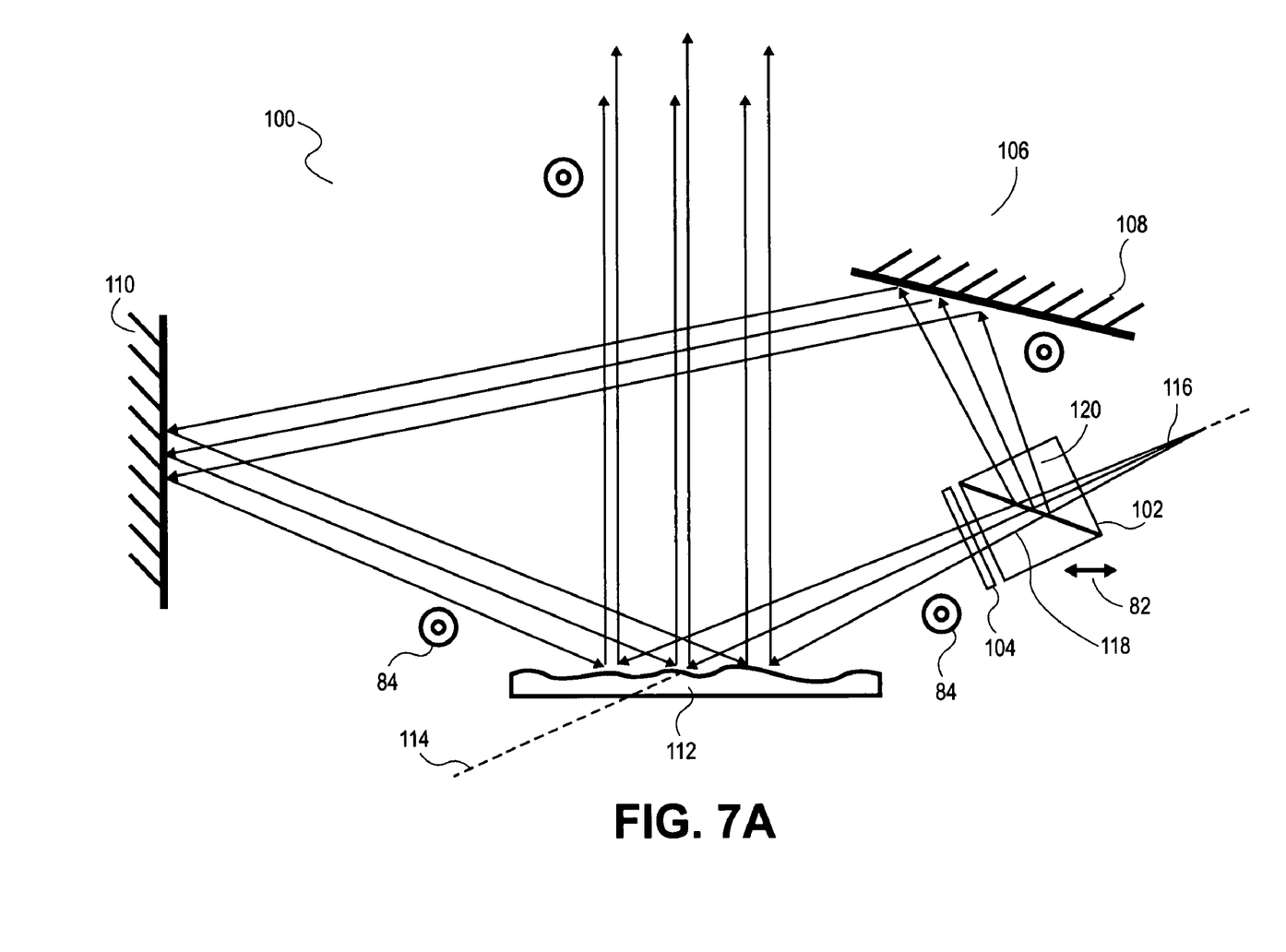
FIGS. 7A and 7B are cross-sectional schematic views of linear polarization subsystems according to alternative embodiments of the present invention.

FIG. 7A illustrates a linear polarization subsystem 100 according to another embodiment of the present invention. The linear polarization subsystem 100 may include a polarizing beam splitter 102, a wave-plate 104, a reflecting system 106, including a first 108 and a second 110 reflective device, and a defractive optical element 112. The polarizing beam splitter 102 and the wave-plate 104 may be similar to the polarizing beam splitter 38 and the wave-plate 40 illustrated in FIGS. 2 and 3. Referring again to FIG. 7A, the polarizing beam splitter 102 may have a central axis 114 extending through a central portion thereof. The first reflective device may be positioned a distance away from the polarizing beam splitter 102 in a direction that is substantially perpendicular to the central axis 114 so that a reflective surface thereof faces the central axis 114 at an angle. The defractive optical element 112 may be positioned along the central axis 114 of the polarizing beam splitter 102. The second reflective device 110 may be positioned on a side of the defractive optical element 112 opposite the polarizing beam splitter 102.

In use, the linear polarization subsystem 110 may be used within the stepper 10 illustrated in FIG. 1 in place of the linear polarization subsystem 34 illustrated in FIGS. 2 and 3. Electromagnetic radiation 116 may be directed into the polarizing beam splitter 102 in a direction substantially parallel to the central axis 114 toward the defractive optical element 112. The electromagnetic radiation may be split, or divided, into a first portion 118 and a second portion 120 by the polarizing beam splitter 102. The first portion 118 may propagate through the polarizing beam splitter 102 in a direction substantially parallel to the central axis 114 and may be linearly polarized in a direction as indicated by the horizontal symbols 82. The second portion 120 of the electromagnetic radiation 116 may be redirected toward the first reflective device 108 and have a linear polarization in a direction as indicated by the vertical symbols 84 as it propagates from the polarizing beam splitter 102.

As the first portion 118 of the electromagnetic radiation 116 passes through the wave-plate 104, the linear polarization of the first portion 118 may be changed such that the first portion 118 is linearly polarized in a direction as indicated by the vertical symbols 84. The first portion 118 of the electromagnetic radiation 116 may then propagate to the defractive optical element 112 where it may be detracted away from the defractive optical element 112 in a direction that is substantially perpendicular to the defractive optical element 112.

The second portion 120 of the electromagnetic radiation 116 may be reflected by the first reflective device 108, through the electromagnetic radiation 116 propagating from the defractive optical element 112, to the second reflective device 110. The second portion 120 may be reflected by the second reflective device 110 toward the defractive optical element 112 and be detracted away from the defractive optical element 112 in a direction substantially parallel to the first portion 118.

Figure 7B:
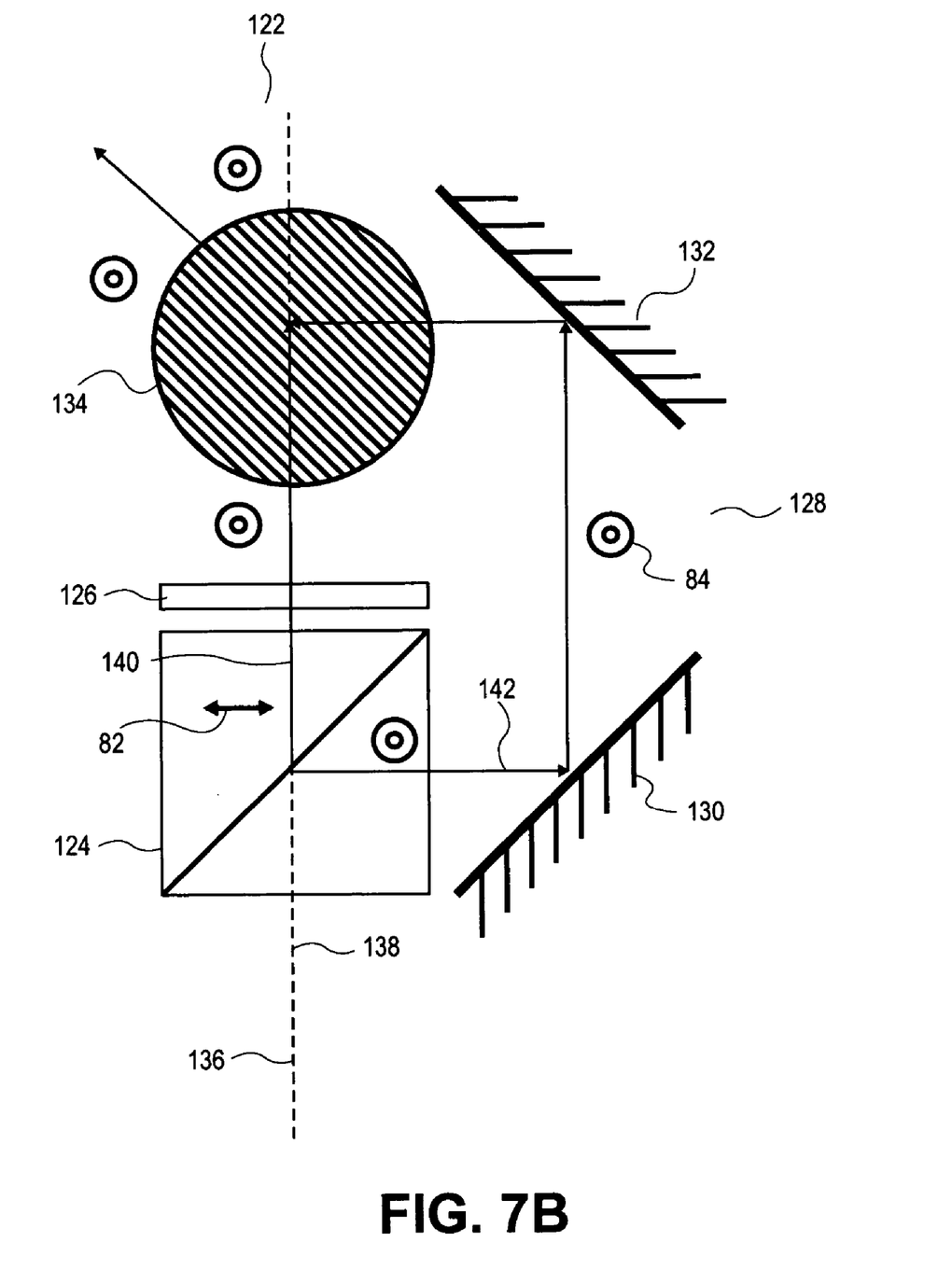

FIG. 7B illustrates a linear polarization subsystem 122 according to a further embodiment of the present invention. The linear polarization subsystem 122 may include a polarizing beam splitter 124, a wave-plate 126, a reflecting system 128, including a first 130 and a second 132 reflecting device, and a volume hologram 134. The polarizing beam splitter 124, the wave-plate 126, and the first reflective device 130 may be similar to the polarizing beam splitter 38, the wave-plate 40, and the first reflective device 46 illustrated in FIGS. 2 and 3. Referring again to FIG. 7B, the second reflective device 132 may be positioned a distance from the first reflective device 130 in a direction that is substantially parallel to a central axis 136 of the polarizing beam splitter 124 with a reflective surface of the second reflective device 132 facing the central axis 136 at an angle of approximately 45 degrees. The hologram 134 may be positioned along the central axis 136 of the polarizing beam splitter 124 on a side of the wave-plate 126 opposite the polarizing beam splitter 124.

In use, electromagnetic radiation 138 may be directed into the polarizing beam splitter 124 toward the hologram 134 in a direction that is substantially parallel to the central axis 136 of the polarizing beam splitter 124. The polarizing beam splitter 124 may split, or divide, the electromagnetic radiation 138 into a first portion 140 and a second portion 142. The first portion 140 of the electromagnetic radiation 138 may propagate through the polarizing beam splitter 124 in a direction that is substantially parallel to the central axis 136 and may be linearly polarized in a direction as indicated by the horizontal symbols 82. The first portion 140 may then pass through the wave-plate 126 where the linear polarization of the first portion 140 may be changed to a linear polarization in a direction as indicated by the vertical symbols 84. The first portion 140 of the electromagnetic radiation 138 may then propagate into the hologram 134 in a direction that is substantially parallel to the central axis 136 of the polarizing beam splitter 124.

The second portion 142 of the electromagnetic radiation 138 may be redirected by the polarizing beam splitter 124 toward the first reflective device 130 in a direction that is substantially perpendicular to the central axis 136 with a linear polarization in a direction as indicated by the vertical symbols 84. The second portion of 142 of the electromagnetic radiation 138 may then be reflected by the first reflective device 130 toward the second reflective device 132 in a direction that is substantially parallel to the central axis 136 of the polarizing beam splitter 124. The second portion 142 may then be reflected by the second reflective device toward the hologram 134 in a direction that is substantially perpendicular to the central axis 136 of the polarizing beam splitter 124. As is commonly understood in the art, the first 140 and second 142 portions of electromagnetic radiation 138 may be co-linearly diffracted by the hologram 134 and redirected away from the central axis 136 of the polarizing beam splitter 124 at an angle of approximately 45 degrees from the central axis 136.

Figure 8:
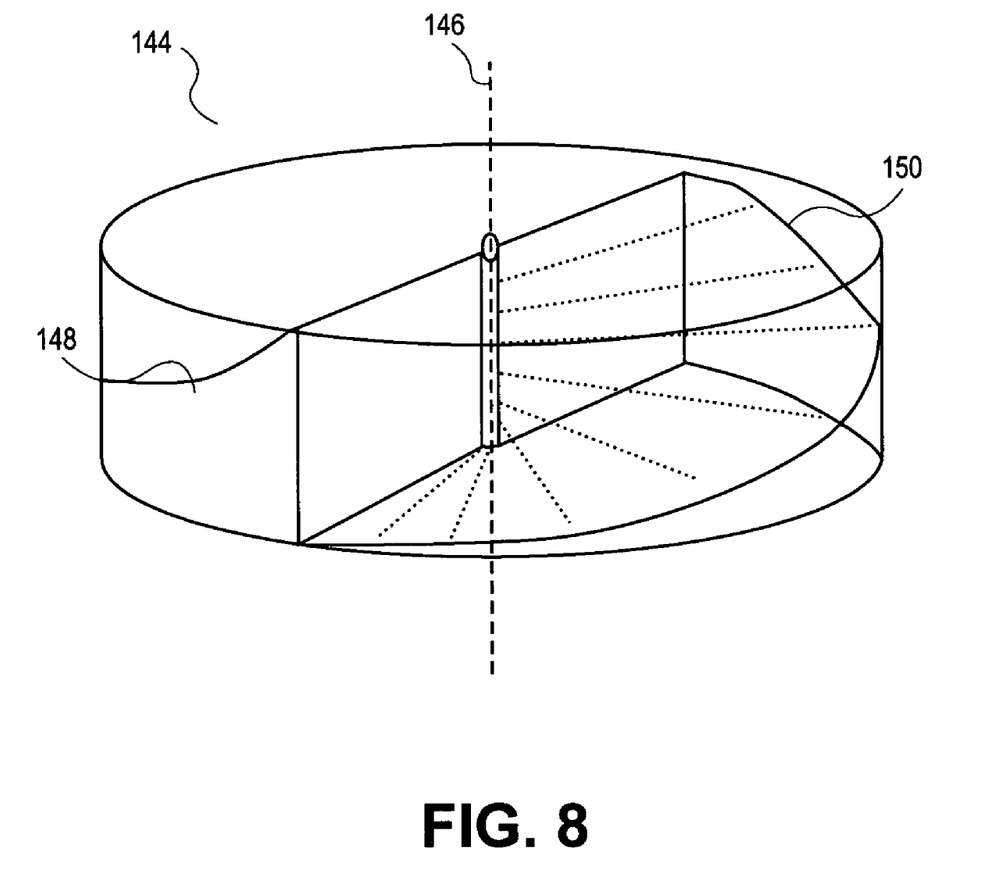
FIG. 8 is perspective view of an annular polarization device according to an alternative embodiment of the present invention.

FIG. 8 illustrates an annular polarization device 144 according to another embodiment of the present invention. The annular polarization device 144 may be made of similar materials and work according to the same principles as the annular polarization device 56 illustrated in FIG. 4. Referring again to FIG. 8, the annular polarization device 144, however, may include a high Verdet constant material with a gradually increasing thickness approximately half way around a central axis 146 thereof. The high Verdet constant material may be shaped such that a first portion 148 and a second portion 150, at an opposing side of the central axis 146, have approximately the same thickness. As will be appreciated by one skilled in the art, the high Verdet constant material and the varying thicknesses of the high Verdet constant material may be selected such that a linearly polarized beam of electromagnetic radiation, similar to that illustrated in FIG. 5, may be propagated through the annular polarization device 144 such that when the beam of electromagnetic radiation leaves the annular polarization device 144, the beam may have an annular polarization similar to that illustrated in FIG. 6.

Other embodiments of the annular polarization device may be glass or crystal structures, such as garnet, doped with materials, such as rare-earth ions, to vary the Verdet constant in the material used in the annular polarization device so that the thickness of the material need not vary as much as the example illustrated yet still have the varying Verdet value as described above. Other materials may be used to as the material of the annular polarization device such as an engineered polymer, a doped glass, and yttrium iron garnet. Additionally, the magnetic field in which the annular polarization device is placed may not be uniform, but may be varied in order to change the Verdet value of particular portions of the device. The magnetic field may be produced by different types of magnetic field generators, such as a samarium cobalt magnet.

Figure 9A:
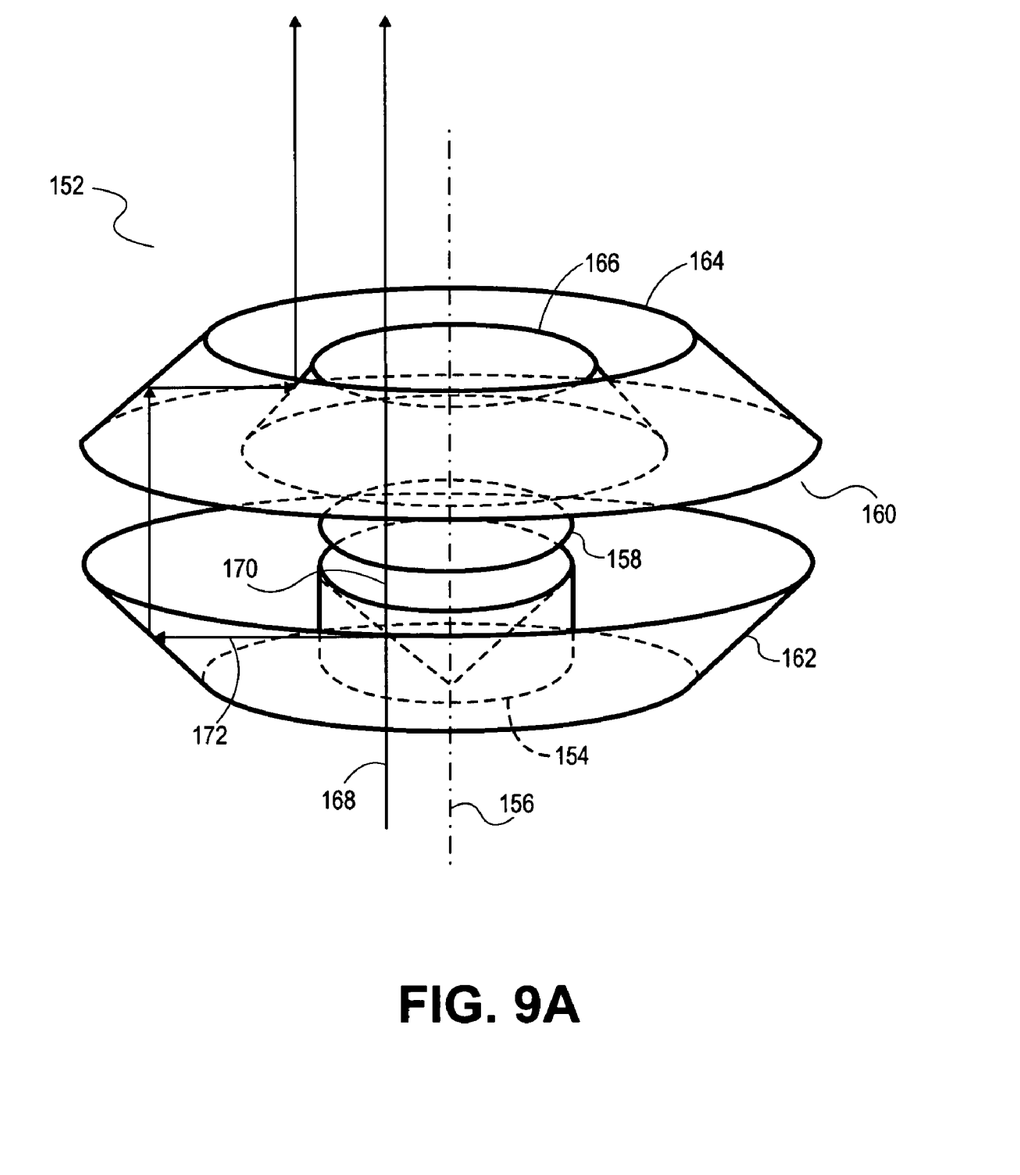
FIG. 9A is a perspective view of a polarization subsystem according to an alternative embodiment of the present invention.
Figure 9B:
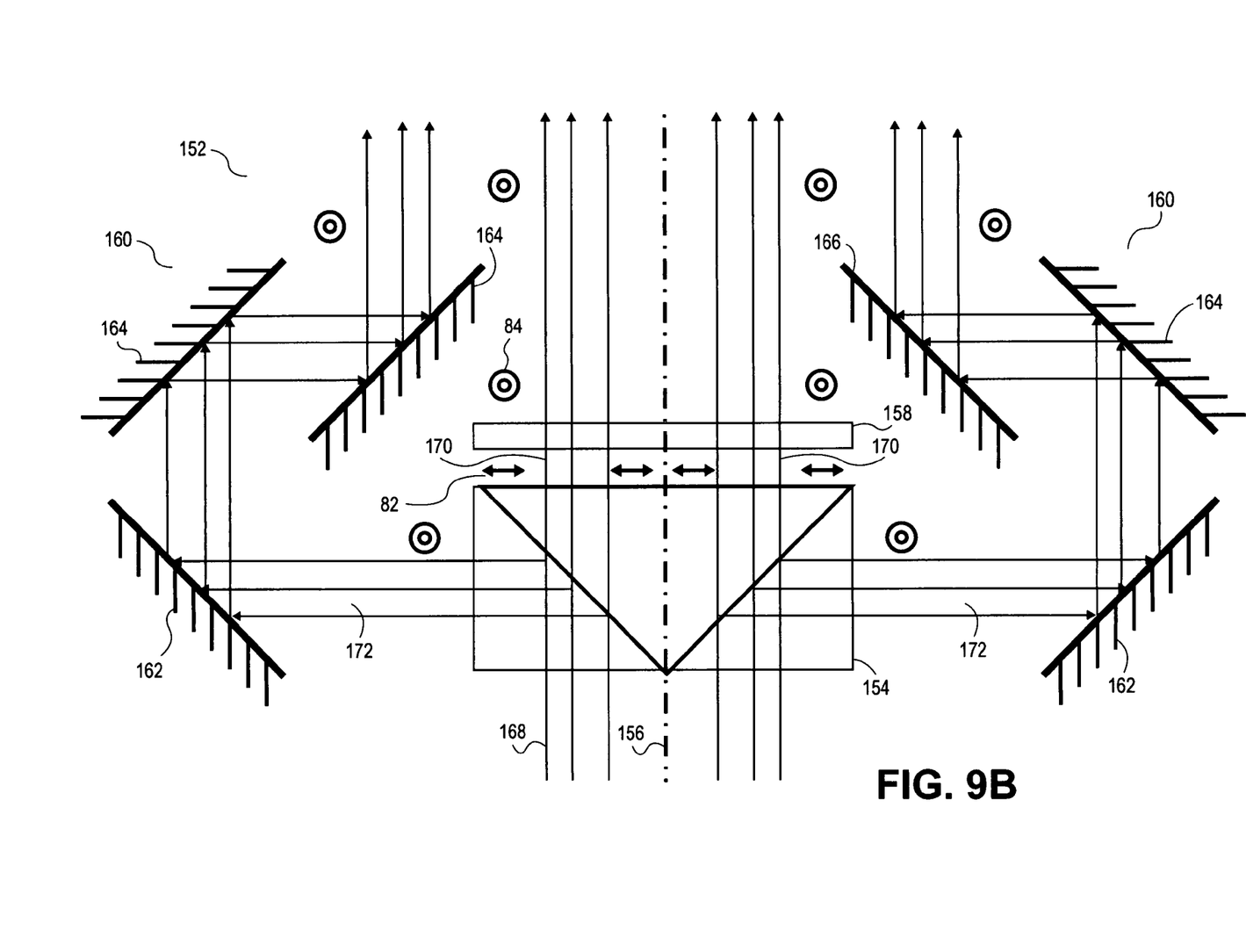
FIG. 9B is a cross-sectional side view of the polarization subsystem illustrated in FIG. 9A.

FIGS. 9A and 9B illustrate a polarization subsystem 152 according to another embodiment of the present invention. The polarization subsystem 152 may include a polarizing beam splitter 154 having a central axis 156, a wave-plate 158, and a reflecting system 160. The reflecting system 160 may include a first reflective device 162, a second reflective device 164, and a third reflective device 166. The polarizing beam splitter 154, the wave-plate 158, the first reflective device 162, the second reflective device 164, and the third reflective device 166 may be radially symmetric about the central axis 156 of the polarizing beam splitter 154.

The first reflective device 162 may be annularly shaped and positioned at a distance from the polarizing beam splitter 154 in a direction that is substantially perpendicular to the central axis 156 of the polarizing beam splitter 154. The first reflective device 162 may have a reflective surface that faces toward the wave-plate 158 in a direction that is approximately 45 degrees to the central axis 156. The second reflective device 164 may be similar to the first reflective device, however, the second reflective device 164 may be positioned a distance away from the first reflective device 162 in a direction that is substantially parallel to the central axis 156 of the polarizing beam splitter 154 and have a reflective surface that faces toward the wave-plate 158 in a direction that is approximately 45 degrees to the central axis 156. The third reflective 166 device may be annularly shaped and positioned within the second reflective device 164 and lie directly between the second reflective device 164 and the central axis 156. The third reflective device 166 may have a reflective surface which faces away from the wave-plate 158 and the central axis 156 at an angle that is approximately 45 degrees to the central axis 156.

In use, electromagnetic radiation 168 may be directed into a side of the polarizing beam splitter 154 opposite the wave-plate 158 in a direction that is substantially parallel to the central axis 156. As the electromagnetic radiation 168 passes through the polarizing beam splitter 154, the electromagnetic radiation may be split, or divided, into a first portion 170 and a second portion 172.

As illustrated in FIG. 9B, when the first portion 170 of the electromagnetic radiation 168 leaves the polarizing beam splitter 154 in a direction that is substantially parallel to the central axis 156, the first portion 170 may be linearly polarized in a direction as indicated by the horizontal symbols 82. As illustrated in FIG. 9B, the horizontal symbols 82 indicate that the first portion 170 of electromagnetic radiation 168, as it leaves the polarizing beam splitter 154, may be linearly polarized in a direction that is parallel to radial lines extending from the central axis 156.

Although only one cross-section of the polarization subsystem 152 is illustrated, it should be understood that the linear polarization of the electromagnetic radiation 168 may appear identical in any cross-section of the polarization subsystem 152 taken at the central axis 156 of the polarizing beam splitter 154, similarly to the cross-section illustrated in FIG. 9B.

The first portion 170 of the electromagnetic radiation 168 may then pass through the wave-plate 158. The first portion 170 of the electromagnetic radiation 168 may then be linearly polarized in a direction as indicated by the vertical symbols 84. In other words, as illustrated in FIG. 9B, after the first portion 170 passes through the wave-plate 158, the first portion 170 is linearly polarized in a direction that is perpendicular to lines extending radially from the central axis 156 of the polarizing beam splitter 154.

The second portion 172 of the electromagnetic radiation 168 may be redirected radially away from the central axis 156 and be linearly polarized in a direction as indicated by the vertical symbols 84. In other words, as illustrated in FIG. 9B, after the second portion 172 of the electromagnetic radiation 168 propagates radially from the polarizing beam splitter 154, the second portion 172 may be linearly polarized in a direction that is perpendicular to radial lines extending from the central axis 156 of the polarizing beam splitter 154. The second portion 172 may be reflected by the first reflective device 162 toward the second reflective device 164 and reflected by the second reflective device 164 toward the third reflective device 166. The third reflective device 166 may reflect the second portion 172 of the electromagnetic radiation 168 away from the wave-plate 158 in a direction that is substantially parallel to the central axis 156.

Thus, as both the first 170 and second 172 portions of the electromagnetic radiation 168 propagate from the polarization subsystem 152, both the first 170 and second 172 portions are linearly polarized in a direction that is perpendicular to lines extending radially from the central axis 156 of the polarizing beam splitter 154. Therefore, a beam of electromagnetic radiation propagating from the polarization subsystem 152 may have an annular polarization similar to that illustrated in FIG. 6.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art

What is claimed:

1. A semiconductor substrate processing apparatus comprising:
    a substrate support to support a semiconductor substrate;
    an electromagnetic radiation source to emit electromagnetic radiation;
    a polarization subsystem comprising:
        a polarizing beam splitter being radially symmetric about a central axis thereof to split the electromagnetic radiation into first and second portions, each of the first and second portions having a plurality of sections, the first portion propagating in a first direction substantially parallel to the central axis of the beam splitter, each respective section of the first portion being linearly polarized in a direction parallel to a line extending between the central axis of the beam splitter and the respective section of the first portion, the second portion propagating radially from the central axis of the beam splitter, each respective section of the second portion being linearly polarized in a direction perpendicular to a line extending between the central axis of the beam splitter and the respective section of the second portion;
        a wave-plate being radially symmetric about the central axis of the beam splitter to change the linear polarization of the first portion such that each respective section of the first portion is linearly polarized in a direction perpendicular to the line extending between the central axis of the beam splitter and the respective section of the first portion; and
        at least one reflective device to reflect the second portion from the beam splitter into substantially the first direction, and
    a reticle positioned between the polarization subsystem and the substrate support, the first and second portions of the electromagnetic radiation to pass through the reticle and onto the semiconductor wafer.

2. The semiconductor substrate processing apparatus of claim 1, wherein the at least one reflective device comprises a first annular mirror being radially symmetric about the central axis of the beam splitter to reflect the second portion of electromagnetic radiation from the beam splitter, a second annular mirror being radially symmetric about the central axis of the beam splitter to reflect the second portion of the electromagnetic radiation from the first mirror, and a third annular mirror being radially symmetric about the central axis of the beam splitter to reflect the second portion of electromagnetic radiation from the second mirror into the first direction.

3. The semiconductor substrate processing apparatus of claim 2, wherein the third mirror has an opening therein, the first portion of electromagnetic radiation to propagate through the opening in the first direction.

4. The semiconductor substrate processing apparatus of claim 3, wherein the electromagnetic radiation source is a light source.

* * * * *